United States Patent [19]

Geffken et al.

[11] Patent Number: 5,339,212
[45] Date of Patent: Aug. 16, 1994

[54] SIDEWALL DECOUPLING CAPACITOR

[75] Inventors: Robert M. Geffken, Burlington, Vt.; Lawrence J. Dunlop, Mt. Pleasant, S.C.

[73] Assignee: International Business Machines Corporation, Armonk, N.Y.

[21] Appl. No.: 984,769

[22] Filed: Dec. 3, 1992

[51] Int. Cl.⁵ ............................................. H01G 1/14
[52] U.S. Cl. ................... 361/306.2; 361/328; 361/306.3; 361/329; 361/330; 29/25.42
[58] Field of Search ............ 361/306.2, 301.2, 321.1, 361/328, 330, 301.4, 306.3, 313, 329; 257/296, 301; 29/25.42, 28

[56] References Cited

U.S. PATENT DOCUMENTS

| | | | |
|---|---|---|---|
| 3,930,065 | 12/1975 | Baker et al. | 427/89 |
| 4,274,124 | 6/1981 | Feinberg et al. | 361/275 |
| 4,349,862 | 9/1982 | Bajorek et al. | 361/328 X |
| 4,376,329 | 3/1983 | Behn et al. | 29/25.42 |
| 4,409,259 | 10/1983 | Bohr et al. | 427/38 |
| 4,707,897 | 11/1987 | Rohrer et al. | 29/25.42 |
| 4,743,464 | 5/1988 | Larguier et al. | 427/58 |
| 4,789,645 | 12/1988 | Calviello et al. | 437/51 |
| 5,155,573 | 10/1992 | Abe et al. | 29/28 |

*Primary Examiner*—Marvin M. Lateef
*Attorney, Agent, or Firm*—Heslin & Rothenberg

[57] ABSTRACT

The invention provides a decoupling capacitor which utilizes a plurality of tungsten studs and metal interconnects to maximize the surface area of the capacitor, thereby increasing the capacitance. The metal interconnects only partially overlap the tungsten studs, forming the first plate of the capacitor, so that the tops of the studs as well as the sides and tops of the interconnects provide the increased surface area. A method of forming the capacitors, and a method of increasing capacitance of a capacitor, are also provided.

13 Claims, 1 Drawing Sheet

SIDEWALL DECOUPLING CAPACITOR

TECHNICAL FIELD

This invention relates to a sidewall decoupling capacitor having increased capacitance over conventional capacitors. More specifically, the invention relates to a capacitor which includes a plurality of filled vias and interconnects as a first plate thereof. The height of the sidewalls of the interconnects increase the surface area of the interconnect layer, thereby increasing the capacitance of the capacitor.

BACKGROUND ART

Simultaneous switching of circuits on logic chips produces transient current spikes that must be decoupled or dampened. Conventional techniques to accomplish this decoupling involve discrete decoupling capacitors which are placed on the printed circuit board. These discrete decoupling capacitors are very expensive. Another drawback to these discrete decoupling capacitors is that as technology requires ever smaller components, such discrete capacitors are required in miniaturized version to fit in very small spaces. Fabrication of such small components is not always feasible.

It is thus desirable to provide for decoupling of transient current spikes by another means. Any capacitor that accomplishes this decoupling should also provide the desired capacitance.

DISCLOSURE OF INVENTION

It is thus an object of the invention to provide a decoupling capacitor which is built into a chip to eliminate the cost of discrete capacitor components.

It is a further object of the invention to provide such a decoupling capacitor with a high surface area, thereby providing high capacitance.

Such a decoupling capacitor as is provided herein is also readily fabricated in miniaturized version to accommodate the small size requirements of today's semiconductor industry.

In furtherance of these objectives, the present invention is directed to an on-chip decoupling capacitor which is located within the metal interconnect wiring levels on a chip. The decoupling capacitor comprises a first plate and a second plate, separated by an insulator layer. The first plate includes a plurality of vias-filled with a conductive material and formed in a semiconductor interlevel insulator layer. An interlevel insulator layer refers to an insulator layer which lies between two levels of metal or conductive material. A plurality of interconnects are electrically connected to the conductive material filling the plurality of vias. The sidewalls of the interconnects provide increased surface area of the capacitor plate, thereby increasing the capacitance of the decoupling capacitor without expending active silicon areas of the chip. The top surface of the conductive material filling the vias (that portion not overlapped by the interconnects), as well as the tops of the interconnects, join the sidewalls of the interconnects in forming the total surface area of the capacitor. The vias may be either circular or rectangular bars of extended length. The latter via design would provide greater capacitor plate area than circular vias.

This maximization of surface area by forming sidewalls on the interconnects accomplishes the objectives of the invention by providing increased capacitance without sacrificing active silicon areas and by providing a decoupling capacitor within the structure of the chip without the need for additional components and their associated expense.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

Figure 1:
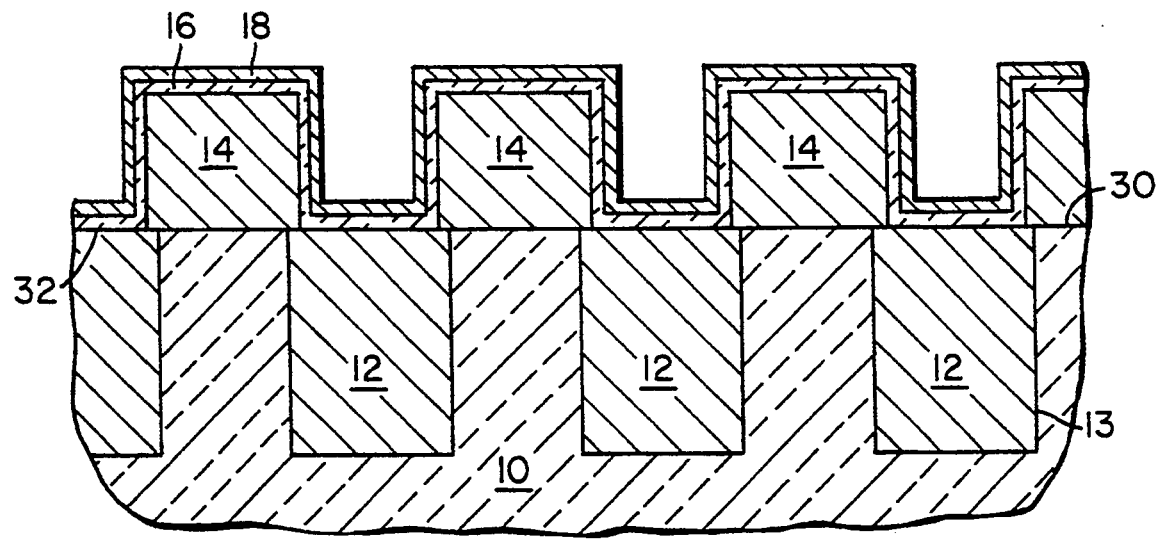
FIG. 1 is a cross-section side elevational view of the decoupling capacitor according to one embodiment of the subject invention.

As mentioned previously, the broad concept of the subject invention is directed to a decoupling capacitor which is built into the metal interconnect wiring levels of a chip. Referring to FIG. 1, such a decoupling capacitor is shown. The decoupling capacitor comprises a first plate which includes a plurality of vias 13 filled with a conductive material 12 and located in a semiconductor interlevel insulator layer 10. The vias extend upward toward a top surface 30 of the interlevel insulator layer 10 and can be filled with any conductor material useful as a via fill, for example tungsten, aluminum copper, or copper. The semiconductor interlevel insulator layer is preferably oxide, but could also be polyimide or some other interlevel metal insulating material.

Once filled, the top surface 32 of the conductive material 12 filling the vias 13 is preferably substantially planar with the top surface 30 of the interlevel insulator layer 10. Partially overlapping and in electrical connection with the filled vias are the interconnects 14. A plurality of such interconnects are provided, preferably on the top surface 30 of the interlevel insulator layer 10, such that each of the filled vias 13 are interconnected to one another by the interconnects 14. In the final structure, all of the filled vias are electrically connected to all of the interconnects due to this arrangement of elements. Any suitable conductive material can be used to form the interconnects, with metals such as aluminum, copper, and tungsten being preferred.

The capacitor further includes a dielectric insulator layer 16 which overlies the first plate. As shown, the dielectric insulator layer covers the exposed top surface of the filled vias, the sidewalls of the interconnects, and the tops of the interconnects. The dielectric insulator can be any suitable material, including silicon nitride. The dielectric insulator layer must be of a sufficient thickness to provide reasonable capacitance in the resulting capacitor structure, while at the same time preventing shorting between the two capacitor plates. The thinner the dielectric insulator layer, the higher the capacitance. Furthermore, the dielectric insulator material can be selected to maximize capacitance. A preferred dielectric insulator layer is silicon nitride which has a dielectric constant of around 7. A suitable thickness of a dielectric insulator layer of silicon nitride is about 500 Angstroms. Oxides, on the other hand, have dielectric constants of 3.8 to 4. Higher capacitance is obtainable with material having a higher dielectric constant. The dielectric insulator layer is preferably applied conformally, for example by chemical vapor deposition or plasma enhanced chemical vapor deposition.

To complete the capacitor structure, a second plate comprising a conductive layer 18 overlies the dielectric insulator layer 16. The conductive layer may of any suitable material, with metals preferred. Such metals include aluminum, titanium nitride, and tungsten. Any suitable material which is conductive so that it provides connection to the next layer, and adheres to the dielectric insulator layer, is suitable. It is possible that a thicker conductive layer as the second plate would be desirable if direct contact and interconnection is desired with the conductive layer.

Figure 2:
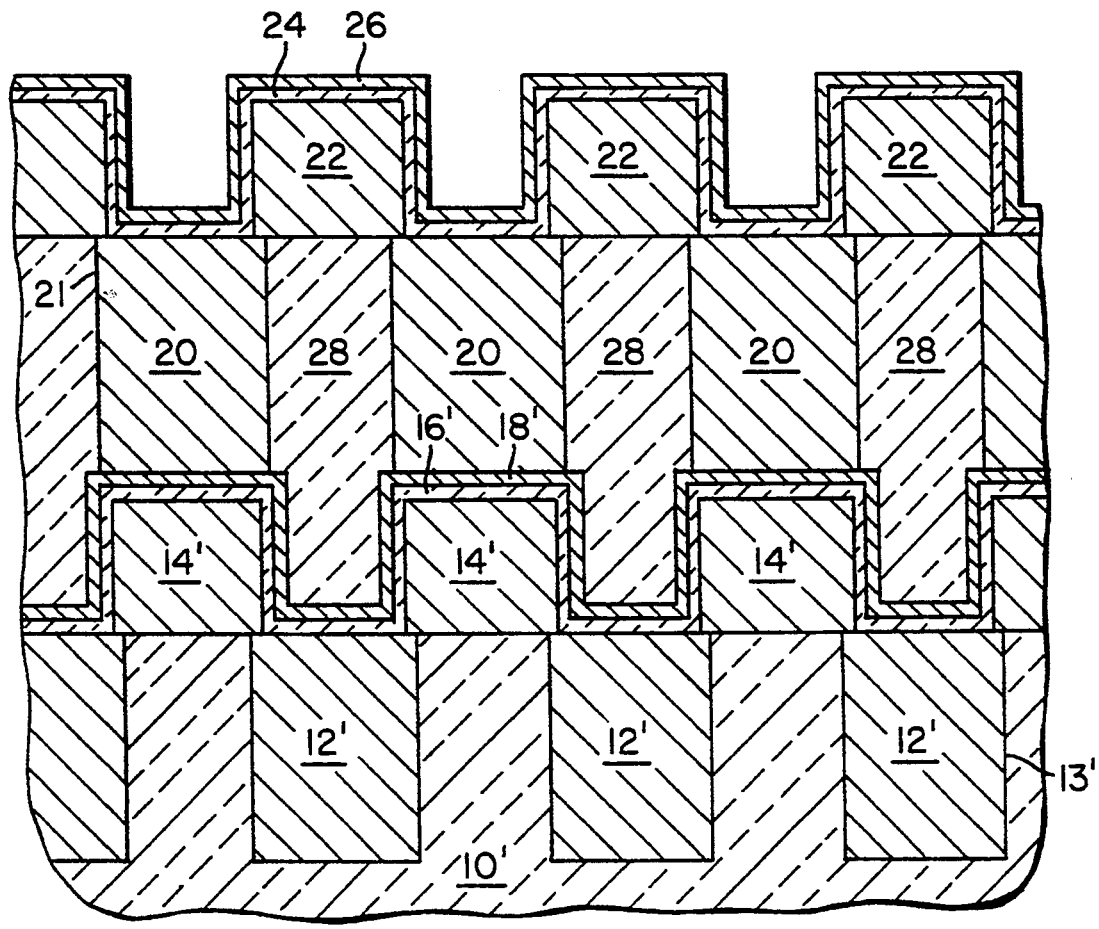
FIG. 2 is a cross-section side elevational view showing how the decoupling capacitor shown in FIG. 1 can be stacked one on top of another.

Alternatively, the capacitor structure as shown in FIG. 1 can also be stacked, one on top of another, as shown in FIG. 2. The first capacitor portion comprises a first plate of an interlevel insulator layer 10' having vias 13' filled with a conductive material 12' therein, and metal interconnects 14'. The first capacitor also comprises a dielectric insulator layer 16', and the second plate of conductive layer 18'. The second capacitor portion comprises a third plate of an interlevel insulator layer 28 having vias 21 filled with a second conductive material 20 therein, and metal interconnects 22. The second capacitor also comprises a second dielectric insulator layer 24, and a fourth plate of conductive layer 26. As shown, a substantially horizontal midpoint of each of the plurality of interconnects of the first plate of a lower capacitor is substantially vertically aligned with a substantially horizontal midpoint of a respective one of the plurality of filled vias of an upper capacitor (relative to the lower capacitor). Some vertical misalignment is acceptable. However, some electrical connection must exist between conductive layer 18' and the filled via 20. Further capacitors as shown in FIG. 1 can be stacked as shown in FIG. 2 on additional interconnect levels to increase the capacitance of the capacitor structure, without utilizing active silicon area of the substrate. This arrangement of stacked capacitors allows electrical connection of all of the filled vias and interconnects to one another, both of the upper and lower capacitors. This in turn increases the surface area of the capacitor structure, thereby increasing the capacitance of the unit.

Thus, the capacitor of the subject invention maximizes capacitance by utilizing a layout of tungsten studs (the vias filled with tungsten as a conductive material) and metal interconnects to increase surface area. By only overlapping a portion of the tungsten studs for the electrical connection, the tops of the studs as well as the sidewalls and tops of the interconnects can form the capacitor's surface area for increased capacitance.

For ease in fabrication, the layers of the capacitor structure can be formed on the entire surface of a wafer. A resist blocking mask can then be applied so that the layers are removed from all areas except where the capacitor structure is desired. The conductive layer and insulator layer are removed using suitable etching techniques, leaving the metal interconnects and tungsten studs as direct contacts, with the capacitor contact nearby.

The resulting decoupling capacitor, using a 1.0 $\mu$m interconnect metal thickness and 500 Angstroms of nitride as a dielectric insulator layer, yields 1.9 fempto farads/$\mu m^2$. The required coupling capacitance for a typical logic chip is about 0.33 fempto farads/$\mu m^2$, so the decoupling capacitor would take up about 1/6 of the area on a single level of metal or 1/12 per level if the two capacitors were stacked together. As indicated above, the area occupied by the capacitor can also be reduced by altering the dielectric insulator layer. By utilizing a material with a higher dielectric constant, the same capacitance can be obtained with a smaller capacitor area. The thickness of the insulator layer can also be altered to control capacitance of the resulting structure.

While the invention has been particularly shown and described with reference to preferred embodiments thereof, it will be understood by those skilled in the art that various changes in form and details may be made therein without departing from the spirit and scope of the invention.

We claim:

1. A capacitor comprising:
   a) a first plate, said first plate comprising:
      an interlevel insulator layer having a top surface thereof;
      a first plurality of vias extending into said top surface of said interlevel insulator layer;
      a conductive material filling each of said first plurality of vias, said conductive material having a top surface thereof;
      a first plurality of interconnect lines overlying said interlevel insulator layer, each of said interconnect lines having a top surface, first and second opposing sidewalls, and a bottom surface, wherein said bottom surface of each of said interconnect lines is positioned upon said top surface of said interlevel insulator layer partially overlapping said conductive material, each of said interconnect lines thereby being electrically connected to said conductive material;
      wherein a top surface of said first plate is formed by non-overlapped top surface of said conductive material, said first sidewalls of said interconnect lines, said top surfaces of said interconnect lines, and said second sidewalls of said interconnect lines;
   b) a dielectric insulator layer overlying said top surface of said first plate; and
   c) a second plate overlying said dielectric insulator layer, said second plate comprising a conductive layer.

2. The capacitor of claim 1 further comprising:
   a) a third plate overlying said second plate, said third plate comprising:
      a second interlevel insulator layer having a top surface thereof;
      a second plurality of vias extending into said top surface of said second interlevel insulator layer;
      a second conductive material filling each of said second plurality of vias, said conductive material having a top surface thereof;
      a second plurality of interconnect lines overlying said second interlevel insulator layer, each of said interconnect lines having a top surface, first and second opposing sidewalls, and a bottom surface, wherein said bottom surface of each of said interconnect lines is positioned upon said top surface of said second interlevel insulator layer partially overlapping said second conductive material, each of said interconnect lines of said second plurality thereby being electrically connected to said second conductive material;
      wherein a top surface of said third plate is formed by non-overlapped top surface of said second conductive material, said first sidewalls of said interconnect lines, said top surfaces of said interconnect lines, and said second sidewalls of said interconnect lines, and wherein a substantially horizontal midpoint of each one of said first plurality of interconnects is substantially vertically aligned with a substantially horizontal midpoint of a respective one of said second plurality of vias;

b) a second dielectric insulator layer overlying said top surface of said third plate; and c) a fourth plate overlying said second dielectric insulator layer, said fourth plate comprising a conductive layer.

3. The capacitor of claim 2 wherein said conductive material filling said first plurality of vias and said second conductive material filling said second plurality of vias each comprise tungsten.

4. The capacitor of claim 1 wherein said interconnect lines comprise metal.

5. The capacitor of claim 1 wherein said dielectric insulator layer comprises silicon nitride.

6. The capacitor of claim 1 wherein said conductive layer comprises titanium nitride.

7. The capacitor of claim 1 wherein said conductive layer comprises aluminum.

8. The capacitor of claim 1 wherein said conductive layer comprises tungsten.

9. The capacitor of claim 1 wherein said top surface of said conductive material is substantially planar with said top surface of said interlevel insulator layer.

10. The capacitor of claim 1 wherein said dielectric insulator layer conformally overlies said top surface of said first plate.

11. A capacitor comprising two or more capacitors stacked one on the other to form relative upper and lower capacitors, each of said two or more capacitors comprising:

a) a first plate, said first plate comprising:
   an interlevel insulator layer having a surface thereof;
   a plurality of vias extending into said top surface of said interlevel insulator layer;
   a conductive material filling each of said first plurality of vias, said conductive material having a top surface thereof;
   a plurality of interconnect lines overlying said interlevel insulator layer, each of said interconnect lines having a top surface, first and second opposing sidewalls, and a bottom surface, wherein said bottom surface of each of said interconnect lines is positioned upon said top surface of said interlevel insulator layer partially overlapping said conductive material, each of said interconnect lines thereby being electrically connected to said conductive material;
   wherein a top surface of said first plate is formed by non-overlapped top surface of said conductive material, said first sidewalls of said interconnect lines, said top surfaces of said interconnect lines, and said second sidewalls of said interconnect lines;

b) a dielectric insulator layer overlying said top surface of said first plate ; and c) a second plate overlying said dielectric insulator layer, said second plate comprising a conductive layer, wherein a substantially horizontal midpoint of each of said plurality of interconnect lines of said first plate of a lower capacitor is substantially vertically aligned with a substantially horizontal midpoint of a respective one of said plurality of vias of said first plate of an upper capacitor.

12. A method of forming a capacitor, said method comprising:

a) forming a plurality of vias extending into a top surface of an interlevel insulator layer;

b) filling each of said plurality of vias with a conductive material, said conductive material having a top surface thereof;

c) forming a plurality of interconnect lines overlying said interlevelinsulator layer, each of said interconnect lines having a top surface, first and second opposing sidewalls, and a bottom surface, wherein said bottom surface of each of said interconnect lines is positioned upon said top surface of said interlevel insulator layer partially overlapping said conductive material, each of said interconnect lines thereby being electrically connected to said conductive material, wherein a top surface of a first plate of a capacitor is formed by a non-overlapped top surface of said conductive material, said first sidewalls of said interconnect lines, said top surface of said interconnect lines, and said second sidewalls of said interconnect lines;

d) forming a dielectric insulator layer over said top surface of said first plate; and e) forming a second plate over said dielectric insulator layer, said second plate comprising a conductive layer.

13. A capacitor formed by the method of claim 12.

* * * * *

UNITED STATES PATENT AND TRADEMARK OFFICE
CERTIFICATE OF CORRECTION

PATENT NO. : 5,339,212
DATED : Aug. 16, 1994
INVENTOR(S) : Geffken et al.

It is certified that error appears in the above-indentified patent and that said Letters Patent is hereby corrected as shown below:

<u>In The Claims</u>:

Column 5, line 38 between "a" and "surface" insert --top--.

Column 6, line 29 delete "interlevelinsulator" and substitute therefor --interlevel insulator--.

Signed and Sealed this

First Day of November, 1994

Attest:

Attesting Officer

BRUCE LEHMAN

Commissioner of Patents and Trademarks